United States Patent
Okuaki et al.

(10) Patent No.: US 11,564,335 B2
(45) Date of Patent: Jan. 24, 2023

(54) SELECTION SUPPORT SYSTEM AND SELECTION SUPPORT METHOD

(71) Applicant: FANUC CORPORATION, Yamanashi (JP)

(72) Inventors: Kenichi Okuaki, Yamanashi (JP); Kazuhiro Yamamoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 943 days.

(21) Appl. No.: 16/364,403

(22) Filed: Mar. 26, 2019

(65) Prior Publication Data
US 2019/0327853 A1  Oct. 24, 2019

(30) Foreign Application Priority Data
Apr. 20, 2018  (JP) .............................. JP2018-081346

(51) Int. Cl.
*H05K 7/20* (2006.01)
*H02P 29/60* (2016.01)
*H05K 9/00* (2006.01)

(52) U.S. Cl.
CPC ............. *H05K 7/207* (2013.01); *H02P 29/60* (2016.02); *H05K 9/0007* (2013.01)

(58) Field of Classification Search
CPC ...... H05K 7/207; H05K 9/0007; H02P 29/60; H02P 5/00; G05B 19/40938
See application file for complete search history.

(56) References Cited

U.S. PATENT DOCUMENTS

2006/0225481 A1* 10/2006 Kato ....................... F04D 27/00
                                                              73/1.01
2017/0205839 A1*  7/2017 Itou ....................... G05B 13/026

FOREIGN PATENT DOCUMENTS

| CN | 201710690546 | * | 8/2017 |
| JP | H03-294904 A | | 12/1991 |
| JP | H09-329505 A | | 12/1997 |
| JP | 2000-271836 A | | 10/2000 |
| JP | 2006-221428 A | | 8/2006 |

(Continued)

OTHER PUBLICATIONS

Exaircorp, Calculating and Choosing the right Cabinet Coolers (Year: 2016).*

(Continued)

*Primary Examiner* — Michael P Nghiem
*Assistant Examiner* — Dacthang P Ngo
(74) *Attorney, Agent, or Firm* — Studebaker & Brackett PC

(57) ABSTRACT

The selection support system selects components constituting a machine tool including a drive system having a motor and a motor drive device configured to drive and control the machine tool, and a housing part configured to house at least a part of the drive system. The selection support system includes an information reception unit configured to receive operation information on operation of the machine tool, machine information on a configuration of the machine tool, and housing part information on the housing part, and a calculation unit. The calculation unit has a temperature estimation unit configured to estimate a temperature of an inside of the housing part, on the basis of the operation information, the machine information, and the housing part information received by the information reception unit.

8 Claims, 7 Drawing Sheets

(56) References Cited

FOREIGN PATENT DOCUMENTS

| | | | |
|---|---|---|---|
| JP | 2006-278437 | A | 10/2006 |
| JP | 2011-088268 | A | 5/2011 |
| JP | 2017-124473 | A | 7/2017 |

OTHER PUBLICATIONS

CN201710690546 English translation (Year: 2017).*
Attabox, Enclosure Temperature Control (Year: 2017).*
Krebs, How to select and size enclosure thermal management system (Year: 2017).*
An Office Action; "Notice of Reasons for Refusal," mailed by the Japanese Patent Office dated Jun. 16, 2020, which corresponds to Japanese Patent Application No. 2018-081346 and is related to U.S. Appl. No. 16/364,403 with English language translation.

* cited by examiner

SELECTION SUPPORT SYSTEM AND SELECTION SUPPORT METHOD

This application is based on and claims the benefit of priority from Japanese Patent Application No. 2018-081346, filed on 20 Apr. 2018, the content of which is incorporated herein by reference.

BACKGROUND OF THE INVENTION

Field of the Invention

The present invention relates to a selection support system and a selection support method for selecting components constituting a machine tool.

Related Art

A motor for use in a machine tool and a motor drive device for driving the motor generate heat as the machine tool operates. Such heat generation by the motor and the motor drive device can cause malfunction or failure of the machine tool.

The system having been proposed in view of such circumstances calculates calorific values of a motor and a motor drive device to estimate the temperature thereof (refer to, for example, Patent Document 1 and Patent Document 2). The system disclosed in either of these patent documents is used to estimate the temperature of the motor drive device and the like of the machine tool, whereby a user is able to take a measure in advance to prevent such heat generation.

Patent Document 1: Japanese Unexamined Patent Application, Publication No. 2011-88268

Patent Document 2: Japanese Unexamined Patent Application, Publication No. 2000-271836

SUMMARY OF THE INVENTION

In the general techniques disclosed in Patent Document 1 and Patent Document 2 described above and the like, the temperature is estimated by taking into consideration only the information on the motor and the motor drive device. The information to be used to estimate the temperature is not sufficient. Therefore, the accuracy in temperature estimation may be low in some cases, and thus a user has difficulty in always taking an appropriate measure based on the estimated temperature.

The object of the present invention is to provide a selection support system and a selection support method enabling to take a more appropriate measure related to the temperatures of a motor and a motor drive device.

(1) A selection support system (for example, a selection support system 1 to be described below) according to the present invention is configured to select components constituting a machine tool, and the machine tool includes a drive system having a motor (for example, a motor 22j to be described below) and a motor drive device (for example, a motor drive device 23k to be described below) configured to drive and control the machine tool, and a housing part (for example, a power magnetics cabinet 21i to be described below) configured to house at least a part of the drive system. The selection support system includes an information reception unit (for example, an input unit 14 to be described below) configured to receive operation information on operation of the machine tool, machine information on a configuration of the machine tool, and housing part information on the housing part, and a calculation unit (for example, a calculation unit 11 to be described below). The calculation unit is characterized to have a temperature estimation unit (for example, a temperature estimation unit 112 to be described below) configured to estimate a temperature of an inside of the housing part, on the basis of the operation information, the machine information, and the housing part information received by the information reception unit.

(2) In the selection support system described in (1), the calculation unit may further have a dimension calculation unit (for example, a dimension calculation unit 113 to be described below) configured to calculate dimensions of the housing part, on the basis of the temperature of the inside of the housing part estimated by the temperature estimation unit and an allowable upper limit temperature of the housing part.

(3) In the selection support system described in (1), the calculation unit may further have a necessity determination unit (for example, a necessity determination unit 114 to be described below) configured to determine whether or not a cooling device is required in the housing part, on the basis of the temperature of the inside of the housing part estimated by the temperature estimation unit, an allowable upper limit temperature of the housing part, and dimensions of the housing part.

(4) In the selection support system described in (3), the calculation unit may further have a cooling capacity calculation unit configured to calculate a required cooling capacity of the cooling device when the necessity determination unit determines that the cooling device is required.

(5) In the selection support system described in (1), the temperature estimation unit may estimate the temperature of the inside of the housing part, on the basis of a cooling capacity of a cooling device to be installed in the housing part and dimensions of the housing part. The calculation unit may further have a selection unit (for example, a selection unit 115 to be described below) configured to select the motor and the motor drive device on the basis of the temperature of the inside of the housing part estimated by the temperature estimation unit and an allowable upper limit temperature of the housing part, such that the temperature of the inside of the housing part becomes equal to or lower than the upper limit temperature.

(6) In the selection support system described in (1), the temperature estimation unit may estimate the temperature of the inside of the housing part, on the basis of the operation information, the machine information and the housing part information, and further a calorific value of a device other than the motor and the motor drive device in the drive system. The other device corresponds to a device in the drive system to be housed in the housing part.

(7) A selection support method according to the present invention selects components constituting a machine tool, and the machine tool includes a drive system having a motor and a motor drive device configured to drive and control the machine tool, and a housing part configured to house at least a part of the drive system. The selection support method includes an information reception step for receiving operation information on operation of the machine tool, machine information on a configuration of the machine tool, and housing part information on the housing part, and a calculation step. The calculation step is characterized to have a temperature estimation step for estimating a temperature of an inside of the housing part, on the basis of the operation information, the machine information, and the housing part information received in the information reception step.

The present invention enables to provide a selection support system and a selection support method enabling to take a more appropriate measure related to the temperatures of a motor and a motor drive device.

DETAILED DESCRIPTION OF THE INVENTION

Figure 1:
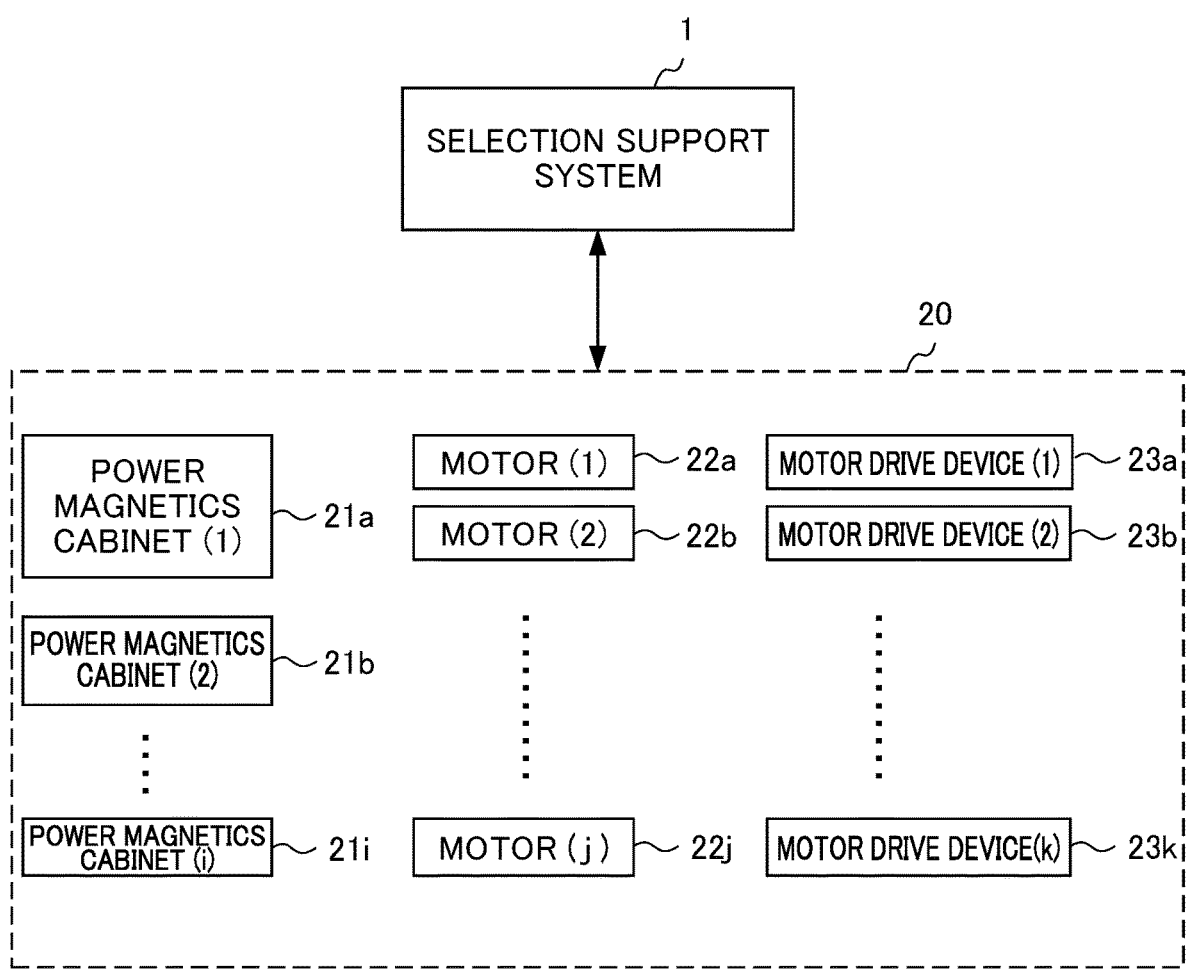
FIG. 1 is a schematic diagram of a selection support system according to a first embodiment of the present invention.

The first embodiment of the present invention will be described below with reference to the drawings. FIG. 1 is a schematic diagram of a selection support system 1 according to the first embodiment of the present invention. The selection support system 1 selects components constituting a machine tool. The components of the machine tool are the elements constituting the machine tool, for example, a power magnetics cabinet, a motor, a motor drive device, a cooling device, and the like. The machine tool includes a drive system having a motor and a motor drive device, and a housing part for housing at least a part of the drive system. Typical machine tools correspond to machining devices for performing various types of machining. The machine tools also broadly include a transport mechanism, a moving mechanism and the like which do not perform machining directly. The motor generates driving force for driving each part of the machine tool. The motor drive device supplies required electric power to the motor, to drive and control the motor. A typical housing part houses the motor drive device, and houses or does not house the motor partially or entirely. A typical housing part is a power magnetics cabinet (control panel). The motor and the motor drive device housed in the housing of the power magnetics cabinet constitute a part of the power magnetics cabinet.

The components serving as selection candidates are also referred to as "selection objects 20." FIG. 1 shows, as the selection objects 20, respective examples of plural types of a power magnetics cabinet 21a to 21i, a motor 22a to 22j, and a motor drive device 23a to 23k. In the case where there is no need to distinguish the power magnetics cabinets 21a to 21i, the motors 22a to 22j, or the motor drive devices 23a to 23k, they are also referred to as a power magnetics cabinet 21, a motor 22, and a motor drive device 23, respectively, as representative components. As not shown in the figure, in the present embodiment, the power magnetics cabinet 21 houses the motor drive device 23 which corresponds to a part of the drive system, whereas the power magnetics cabinet 21 does not house the motor 22.

The selection support system 1 selects a specific component from among the selection objects 20 by the method to be detailed below. After selecting a specific component, the selection support system 1 estimates the temperature of the inside of the power magnetics cabinet also on the basis of other information. The indication of "select" includes not only selecting (completing selection) but also supporting (assisting) in selection. The supporting in selection includes the case where plural types of selection candidates are presented so as to make a user complete the selection, and the case where merely the determination materials in selection are presented. In the present embodiment, the selection objects 20 are the power magnetics cabinet 21, the motor 22, and the motor drive device 23 to be mounted on the machine tool. The selection objects 20 need not to be narrowed down to one type in the selection. The selection objects 20 may be narrowed down to about two or three types, and thereafter one type may be made to be selected from among the two or three types. In the example shown in FIG. 3, the motors are narrowed down to two types, and thereafter one type is selected from the two types, while the motor drive devices are narrowed down to two types, and thereafter one type is selected from the two types. As for a power magnetics cabinet, determination materials in selecting a power magnetics cabinet (in selecting a cooling device of the power magnetics cabinet) are presented. It is noted that the selection objects 20 may include other devices.

Figure 2:
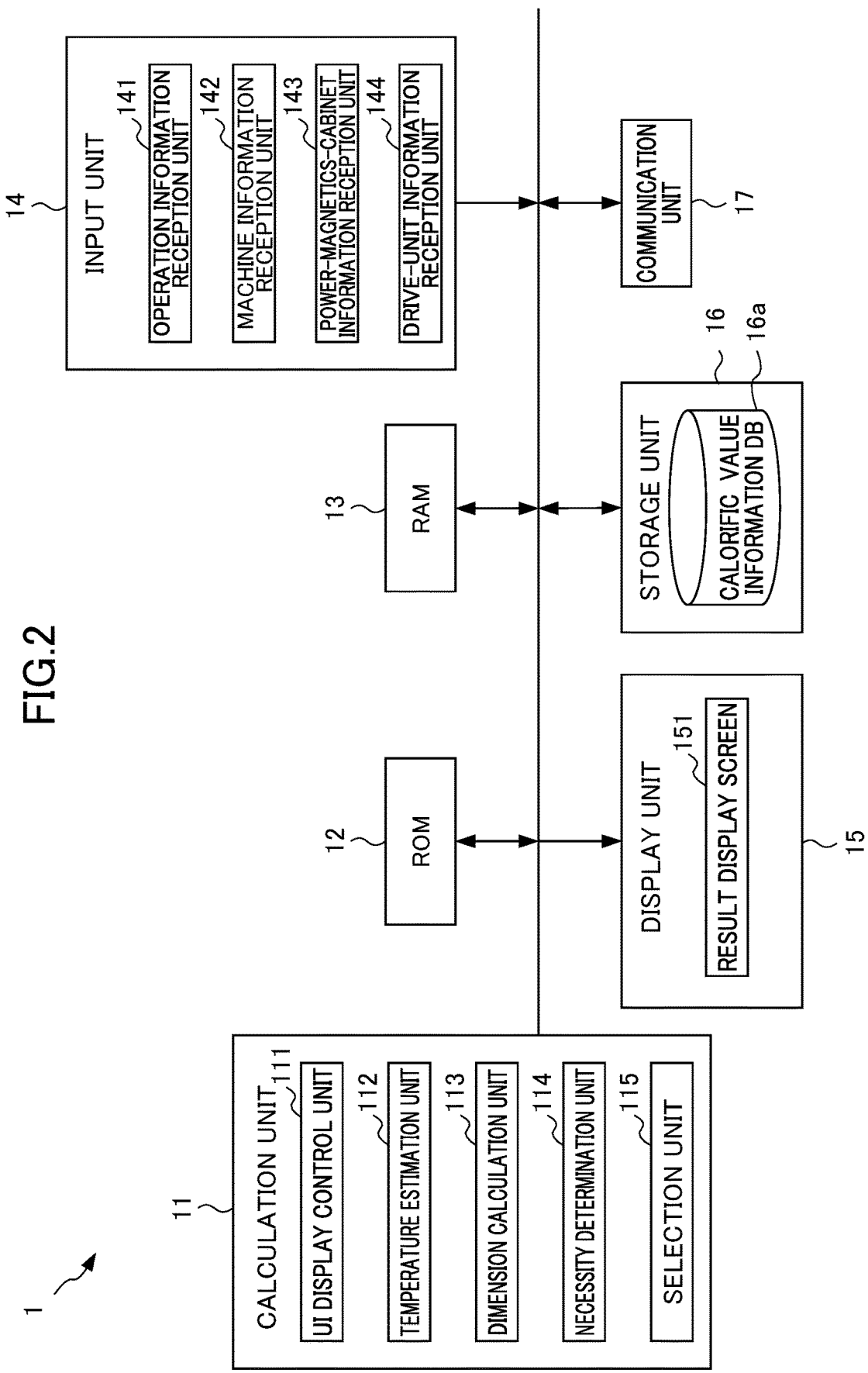
FIG. 2 is a functional block diagram of the selection support system according to the first embodiment of the present invention.

FIG. 2 is a functional block diagram of the selection support system according to the first embodiment of the present invention. As shown in FIG. 2, the selection support system 1 includes a calculation unit 11, a ROM 12, a RAM 13, an input unit 14, a display unit 15, a storage unit 16, and a communication unit 17.

The calculation unit 11 controls the entire selection support system 1, by executing the various types of programs stored in the storage unit 16. In an example, the calculation unit 11 executes the program for performing processing (hereinafter, referred to as "selection processing") to select the power magnetics cabinet 21, the motor 22 and the motor drive device 23 from among the selection objects 20.

The input unit 14 receives the operation information on the operation of the machine tool, the machine information on the configuration of the machine tool, and the housing part information on the power magnetics cabinet. The operation information includes, for example, a type of processing such as cutting, plastic working, or welding, and a degree of machining speed. The machine information is, for example, information on a machining axis. The housing part information includes, for example, dimensions of the power magnetics cabinet and an allowable upper limit temperature of the power magnetics cabinet.

As will be detailed below, the input unit 14 includes an operation information reception unit 141, a machine information reception unit 142, a power-magnetics-cabinet information reception unit 143, and a drive-unit information reception unit 144. The operation information reception unit 141 receives the operation information, the machine information reception unit 142 receives the machine information, the power-magnetics-cabinet information reception unit 143 receives the housing part information, and the drive-unit information reception unit 144 receives the information on the motor 22 and the motor drive device 23, respectively through the input operation performed by a user. Then, on the basis of the information input in the input unit 14, the calculation result and the like processed by the calculation unit 11 are displayed on a result display screen 151 of the display unit 15.

The ROM (Read Only Memory) 12 stores the program for controlling the entire selection support system 1, a program to be used in the selection processing, and the like. These programs are to be executed on the basis of the processing by the calculation unit 11. The RAM (Random Access Memory) 13 is a so-called working memory in which data is temporarily read/written on the basis of the processing by the calculation unit 11.

The storage unit 16 records a calorific value information database (calorific value information DB) 16a to be used in the selection processing to be described below. The calorific value information database 16a stores information on the calorific values caused by the operation of the motor 22 and the motor drive device 23. The information on the calorific values is acquired through measurement in advance or calculation. The communication unit 17 communicates with a communication device or the like which is not shown, thereby, for example, receiving data to be used in calculation or transmitting data on calculation result.

[Details of Calculation Unit 11]

A program for the selection processing is executed, whereby a UI display control unit 111, a temperature estimation unit 112, a dimension calculation unit 113, a necessity determination unit 114, and a selection unit 115 are formed in the calculation unit 11. The selection support system 1 is able to acquire information as appropriate, by accessing the calorific value information database 16a storing various types of information such as on the calorific values and the dimensions of the power magnetics cabinet, which are associated with model numbers or the like of components (the power magnetics cabinet 21, the motor 22, and the motor drive device 23).

The UI display control unit 111 displays a user interface screen (UI screen) for allowing a user to input and output various types of information, in the selection processing. In an example, the UI display control unit 111 displays an input screen (on the operation information reception unit 141) for the information on the operation (operation information) of the machine tool, an input screen (on the machine information reception unit 142) for the information on the configuration (machine information) of the machine tool, an input screen (on the power-magnetics-cabinet information reception unit 143) for the information on the size of the power magnetics cabinet and the upper limit temperature (housing part information) of the power magnetics cabinet, and an input screen (on the drive-unit information reception unit 144) for the information on the motor 22, the motor drive device 23 (such as an amplifier), and other devices (such as a PLC) (drive-unit information), and also receives the above-described information input by a user. The UI display control unit 111 displays a screen (result display screen 151) indicating the result of selection of selected components or the like.

The temperature estimation unit 112 estimates the temperature of the inside of the power magnetics cabinet 21 on the basis of at least the information input in the operation information reception unit 141, the machine information reception unit 142, and the power-magnetics-cabinet information reception unit 143. Alternatively, the temperature estimation unit 112 may estimate the temperature by further using the information input in the drive-unit information reception unit 144. The temperature estimation unit 112 estimates the temperature of the inside of the power magnetics cabinet 21 by referring to the input information and the calorific value information database 16a recorded in the storage unit 16.

The dimension calculation unit 113, which is configured to function in the second embodiment, calculates the dimensions of the power magnetics cabinet 21, on the basis of the temperature estimated by the temperature estimation unit 112 and the allowable upper limit temperature of the power magnetics cabinet 21.

The necessity determination unit 114, which is configured to function in the third embodiment, determines whether or not a cooling device is required in the power magnetics cabinet 21, on the basis of the temperature estimated by the temperature estimation unit 112, the allowable upper limit temperature of the power magnetics cabinet 21, and the dimensions of the power magnetics cabinet 21. The cooling device is, for example, a heat exchanger or a cooling device.

The selection unit 115, which is configured to function in the fourth embodiment, selects the motor 22, the motor drive device 23 and the like on the basis of the temperature estimated by the temperature estimation unit 112 and the allowable upper limit temperature of the power magnetics cabinet 21, such that the temperature of the inside of the power magnetics cabinet 21 becomes equal to or lower than the upper limit temperature.

Figure 3:
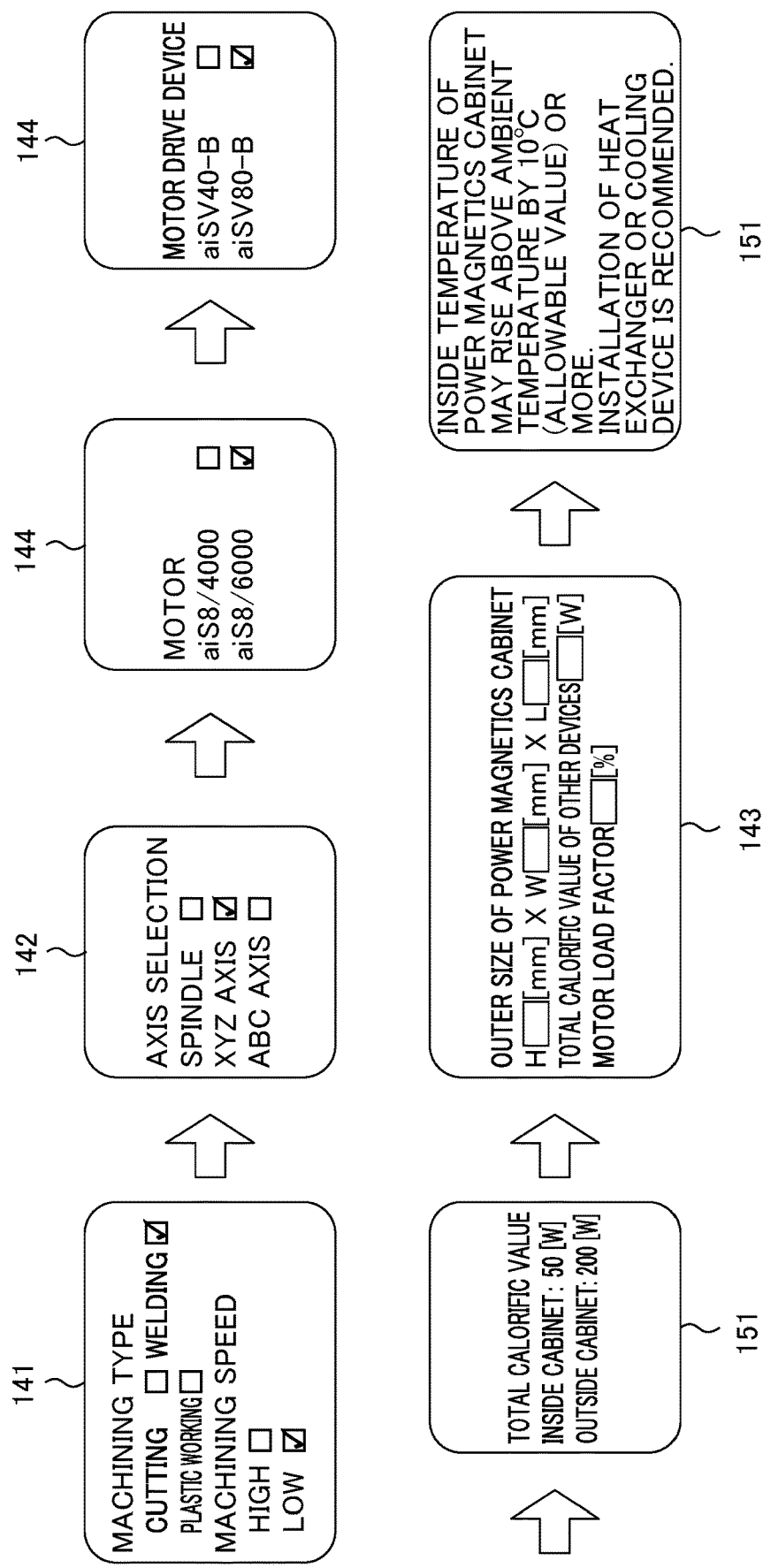
FIG. 3 is a diagram illustrating one example of an input unit and a display unit shown in FIG. 2.

FIG. 3 is a schematic diagram indicating one example of each of the input screens of the input unit 14. The arrows shown in the figure indicate that the input screen changes successively. It is noted that the indicated order of input is just one example. The input screen may change in another order.

The screen for selecting operation information such as on "Machining type" and "Machining speed" is displayed on the operation information reception unit 141. The temperature of the inside of the power magnetics cabinet 21 may rise or fall depending on the calorific values of the motor drive device 23 and the like, in some cases. Since the calorific value of the motor drive device 23 depends on machining speed and a type of machining, such information is taken into consideration when the temperature estimation unit 112 estimates the temperature.

The screen for selecting information on "Axis selection" as machine information is displayed on the machine information reception unit 142. The calorific values of the motor drive device 23 and the like may change depending on a type of axis selection of the machine tool. Accordingly, a type of axis selection is taken into consideration when the temperature estimation unit 112 estimates the temperature.

On the drive-unit information reception unit 144, the types of the motor and the motor drive device automatically selected are displayed, or alternatively the screen for selecting a type of the motor is displayed in the case where a user selects a motor. Each type of motors has a corresponding motor drive device, and in addition respective types of motor drive devices generate different calorific values. Accordingly, a type of the motor is taken into consideration when the temperature estimation unit 112 estimates the temperature.

The indication of "Total calorific value" in the power magnetics cabinet 21 estimated on the basis of the above-described input information by the temperature estimation unit 112 is displayed on the result display screen 151. Alternatively, power information (not shown) such as on "Power consumption" or "Loss power" may be displayed. It is noted that these types of display may be omitted.

The screen for inputting the dimensions (outer size) of the power magnetics cabinet 21 is displayed on the power-magnetics-cabinet information reception unit 143. A user is able to input a height H [mm], a width W [mm], and a length L [mm] as dimensions. A user is further able to input the total calorific value of other devices and a load factor of the motor. The total calorific value of other devices may be input on the basis of catalog values or the like. A user individually sets a load factor of the motor with respect to the rated load of the motor. In an example, when a load factor is set to 50% in order to allow a margin in the operation of a spindle motor, the rotation number of the motor is set to 50% of the rated value. The screen, which is not shown in the figure, for inputting the allowable upper limit temperature of the power magnetics cabinet 21 is also displayed on the power-magnetics-cabinet information reception unit 143.

Guidance such as for recommending installation of a cooling device is displayed on the result display screen 151, on the basis of the temperature estimated by the temperature estimation unit 112 and the like.

[Selection Processing According to First Embodiment]

Figure 4:
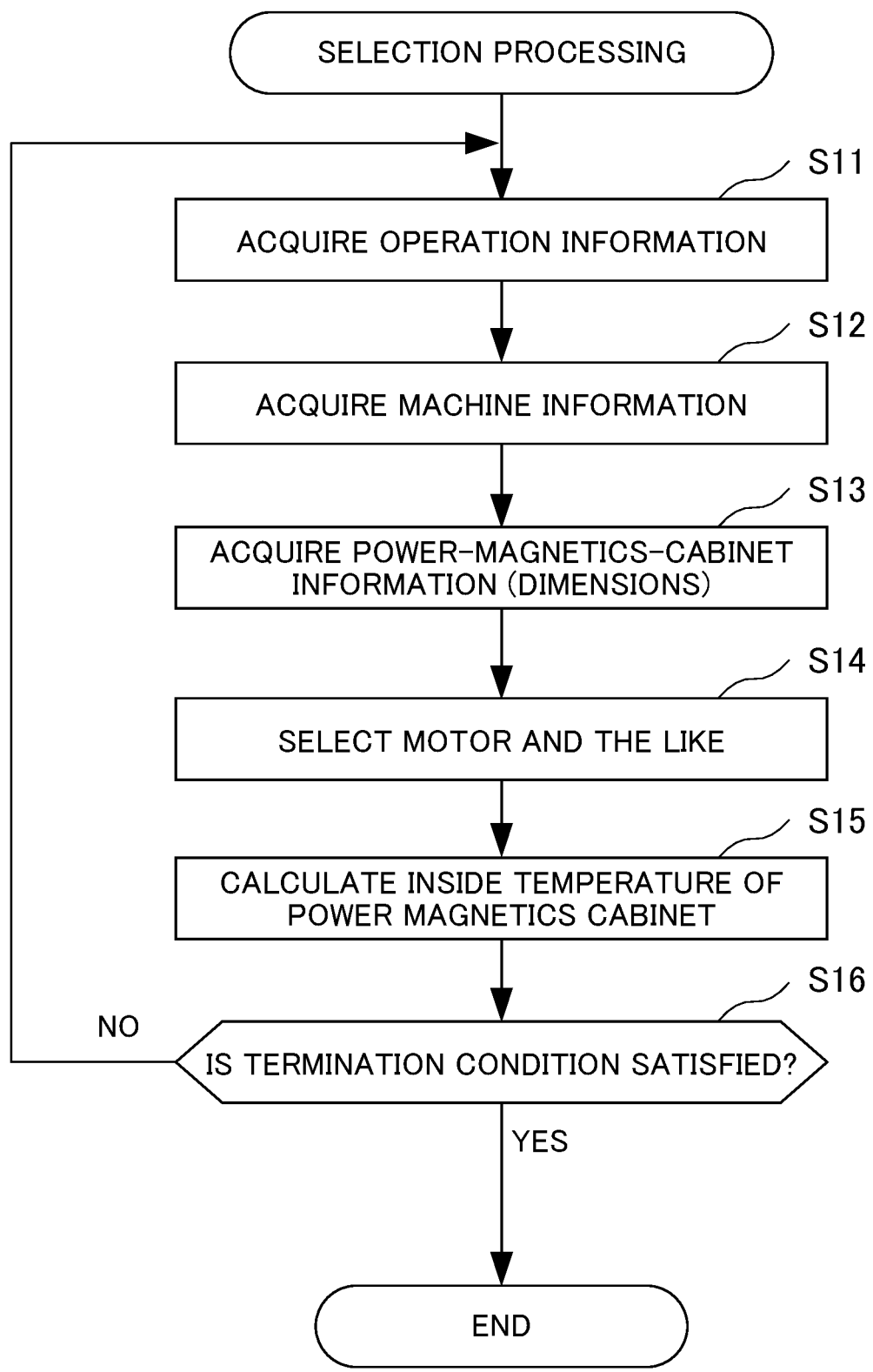
FIG. 4 is a flowchart indicating selection processing according to the first embodiment of the present invention.

FIG. 4 is a flowchart indicating the selection processing to be executed in the first embodiment. In step S11, the calculation unit 11 acquires the operation information, for example, the above-described "Machining speed," input in the operation information reception unit 141. In step S12, the calculation unit 11 acquires the machine information, for example, the type of "Axis selection" described above, input in the machine information reception unit 142. In step S13, the calculation unit 11 acquires the information on the control panel, for example, "Dimensions," input in the power-magnetics-cabinet information reception unit 143. In step S14, the calculation unit 11 acquires the type of the motor and the like selected by a user. The information acquired in step S11 to step S14 is temporarily recorded in the RAM 13.

In step S15, the temperature estimation unit 112 of the calculation unit 11 reads out various types of information temporarily recorded in the RAM 13 in step S11 to step S14. The temperature estimation unit 112 calculates the calorific value of the motor drive device on the basis of "Machining speed," "Axis selection," and the acquired type of the motor, by referring to the calorific value information database 16a stored in the storage unit 16, to estimate the temperature of the inside of the power magnetics cabinet 21 on the basis of the "Dimensions" of the power magnetics cabinet 21. From the calorific value information database 16a, which is, for example, a database in a table format, the temperature estimation unit 112 is able to acquire the calorific value corresponding to the read-out information.

In step S16, whether or not a termination condition is satisfied is determined. One example of the termination condition is that the estimated temperature is displayed on the result display screen 151. As described above, the selection processing in step S11 to step S16 enables to estimate the temperature of the inside of the power magnetics cabinet 21 with higher accuracy, by taking into consideration the operation information and the machine information of the machine tool, and further the information on the power magnetics cabinet 21.

[Selection Processing According to Second Embodiment]

Figure 5:
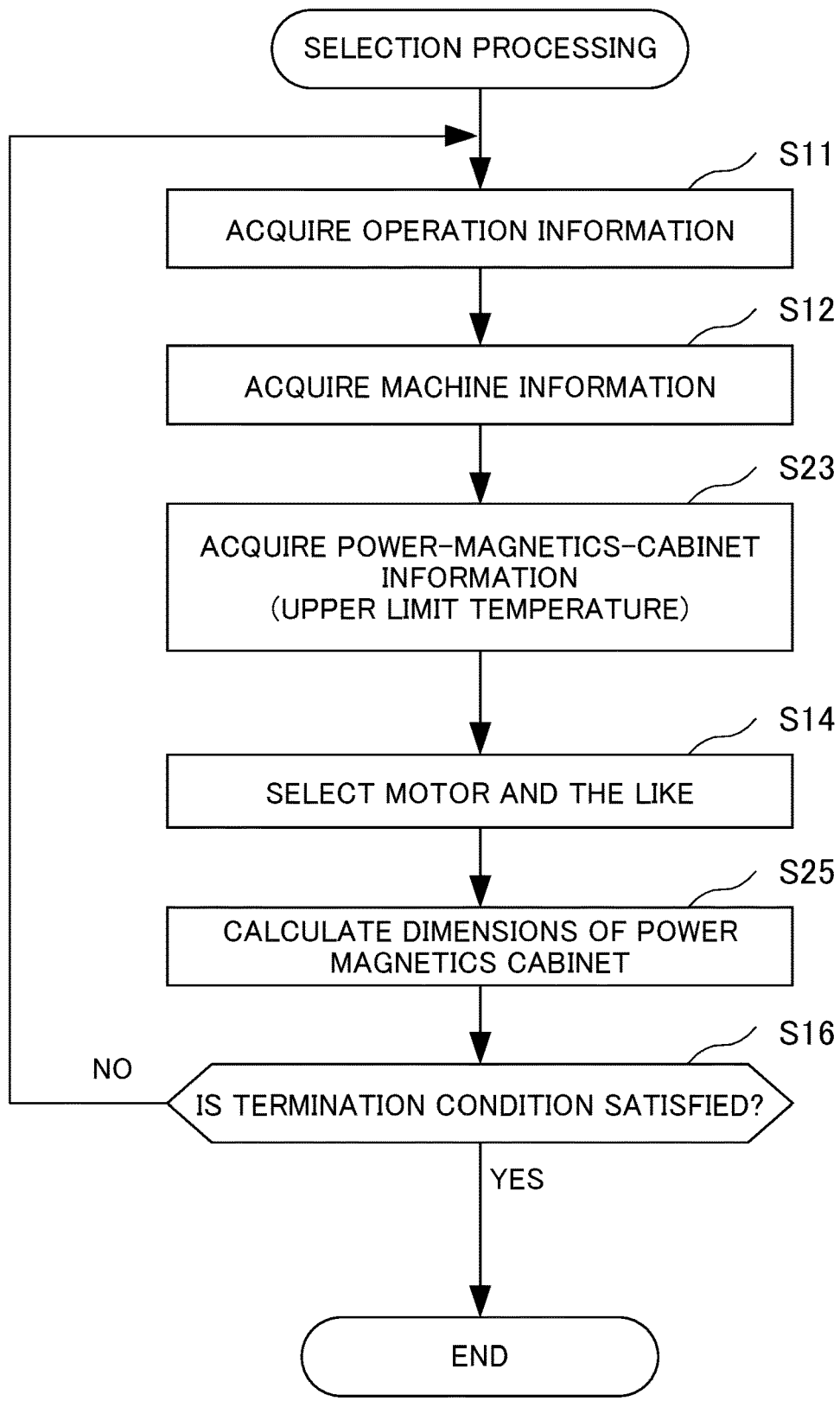
FIG. 5 is a flowchart indicating selection processing according to a second embodiment of the present invention.

The second embodiment is described with reference to FIG. 5. In the second embodiment, the dimension calculation unit 113 further functions in the selection processing, as compared with the first embodiment. That is, the dimension calculation unit 113 calculates the dimensions of the housing part, on the basis of the temperature of the inside of the housing part (power magnetics cabinet) estimated by the temperature estimation unit and the input upper limit temperature of the housing part. It is noted that in FIG. 5, the same reference numeral is assigned to the same processing as in the first embodiment.

In step S11, the calculation unit 11 acquires the operation information. In step S12, the calculation unit 11 acquires the machine information. In step S23, a user inputs an allowable upper limit temperature of the power magnetics cabinet 21 via the power-magnetics-cabinet information reception unit 143 of the input unit 14. The calculation unit 11 acquires the upper limit temperature. In step S14, the calculation unit 11 acquires the type of the motor and the like selected by a user. The information acquired in step S11 to step S14 is temporarily recorded in the RAM 13.

In step S25, the dimension calculation unit 113 calculates the dimensions of the power magnetics cabinet 21 on the basis of the information temporarily recorded in the RAM 13. Specifically, the dimension calculation unit 113 calculates such dimensions of the power magnetics cabinet 21 that the temperature of the inside of the power magnetics cabinet 21 does not exceed the upper limit temperature when the motor drive device 23 and the like housed in the power magnetics cabinet 21 are driven on the basis of the operation information and the machine information.

In step S16, whether or not a termination condition is satisfied is determined. One example of the termination condition is that the dimensions of the power magnetics cabinet 21 are displayed on the result display screen 151. As described above, the selection processing in step S11 to step S16 enables to calculate the dimensions of the power magnetics cabinet 21 by taking into consideration the operation information and the machine information of the machine tool, and further the information on the upper limit temperature of the power magnetics cabinet 21, resulting in enabling to estimate the temperature of the inside of the power magnetics cabinet 21 with higher accuracy.

[Selection Processing According to Third Embodiment]

Figure 6:
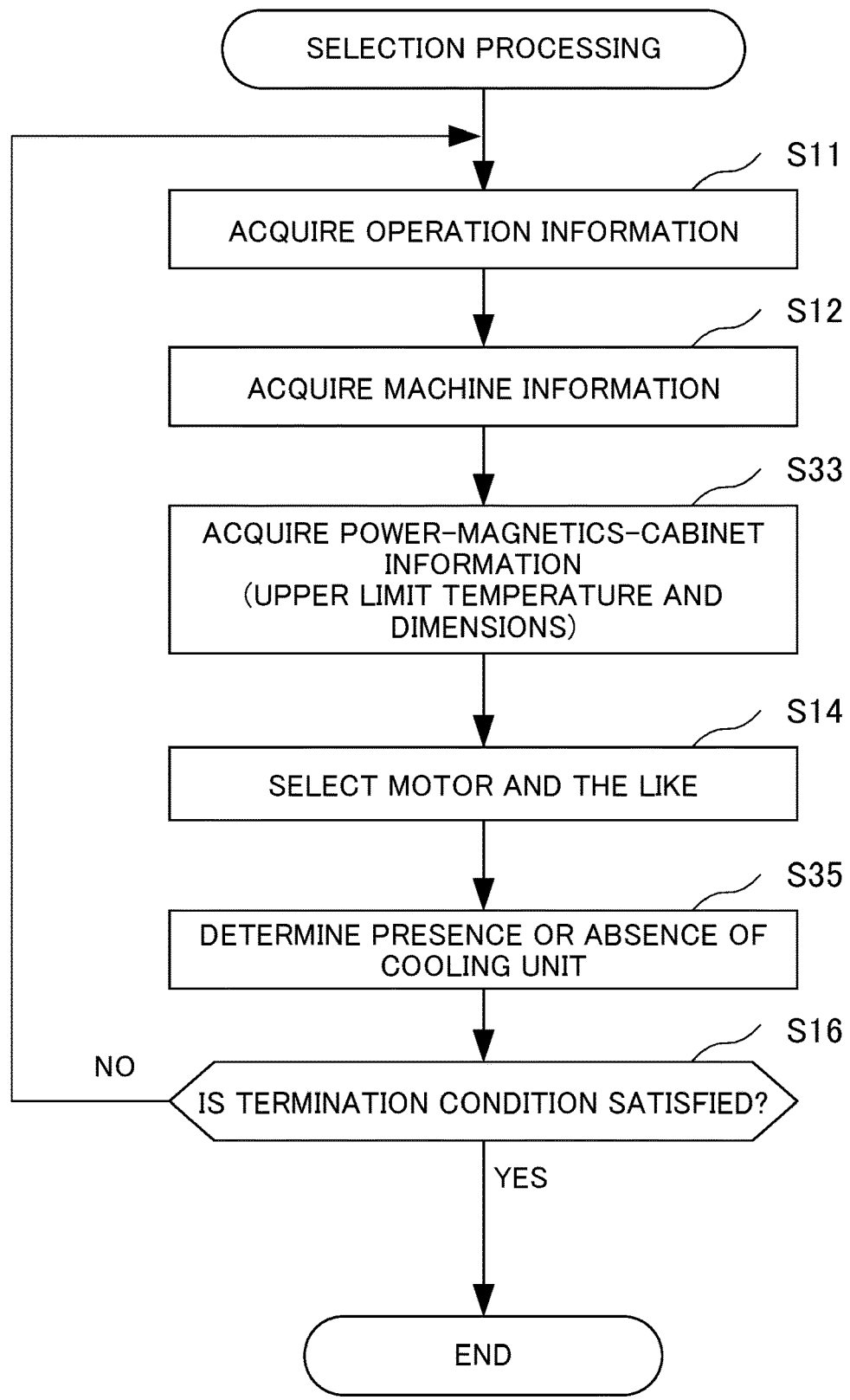
FIG. 6 is a flowchart indicating selection processing according to a third embodiment of the present invention.

The selection processing according to the third embodiment is described with reference to FIG. 6. In the third embodiment, the necessity determination unit 114 further functions in the selection processing, as compared with the first embodiment. That is, in the selection processing according to the third embodiment, the necessity determination unit 114 determines whether or not a cooling device is required in the power magnetics cabinet 21, on the basis of the temperature of the inside of the power magnetics cabinet 21 estimated by the temperature estimation unit 112, the input upper limit temperature of the power magnetics cabinet 21, and the dimensions of the power magnetics cabinet 21. In the third embodiment, in the case where the upper limit temperature and the dimensions of the power magnetics cabinet 21 are not able to be changed, a cooling device needs to be installed in the power magnetics cabinet 21. Therefore, the selection support system 1 determines whether or not a cooling device is required. It is noted that in FIG. 6, the same reference numeral is assigned to the same processing as in the first embodiment or the second embodiment.

In step S11, the calculation unit 11 acquires the operation information. In step S12, the calculation unit 11 acquires the machine information. In step S33, the calculation unit 11 acquires the allowable upper limit temperature of the power magnetics cabinet 21 and the dimensions of the power magnetics cabinet 21. In step S14, the calculation unit 11 acquires the type of the motor, and records them temporarily in the RAM 13.

In step S35, the temperature estimation unit 112 estimates the temperature of the inside of the power magnetics cabinet 21, on the basis of the information temporarily recorded in the RAM 13 in step S11 to step S14. In the case where the temperature of the inside of the power magnetics cabinet 21 is estimated to exceed the upper limit temperature when the motor drive device 23 and the like housed in the power magnetics cabinet 21 are driven on the basis of the operation information and the machine information, the necessity determination unit 114 determines that a cooling device is required.

In step S16, whether or not a termination condition is satisfied is determined. One example of the termination condition is that the result of determination of whether or not a cooling device is required is displayed on the result display screen 151. As described above, the selection processing in step S11 to step S16 enables to estimate the temperature of the power magnetics cabinet 21 with high accuracy, by taking into consideration the operation information and the machine information of the machine tool and further the information on the upper limit temperature and the dimensions of the power magnetics cabinet 21, and further enables to acquire the result of determination of whether or not a cooling device is required.

It is noted that the calculation unit 11 may further include a cooling capacity calculation unit. In the case where the above-described necessity determination unit 114 determines that a cooling device is required, the cooling capacity calculation unit calculates the cooling capacity required to keep the temperature below the upper limit temperature. This allows a user to receive support in selecting a cooling device.

[Selection Processing According to Fourth Embodiment]

Figure 7:
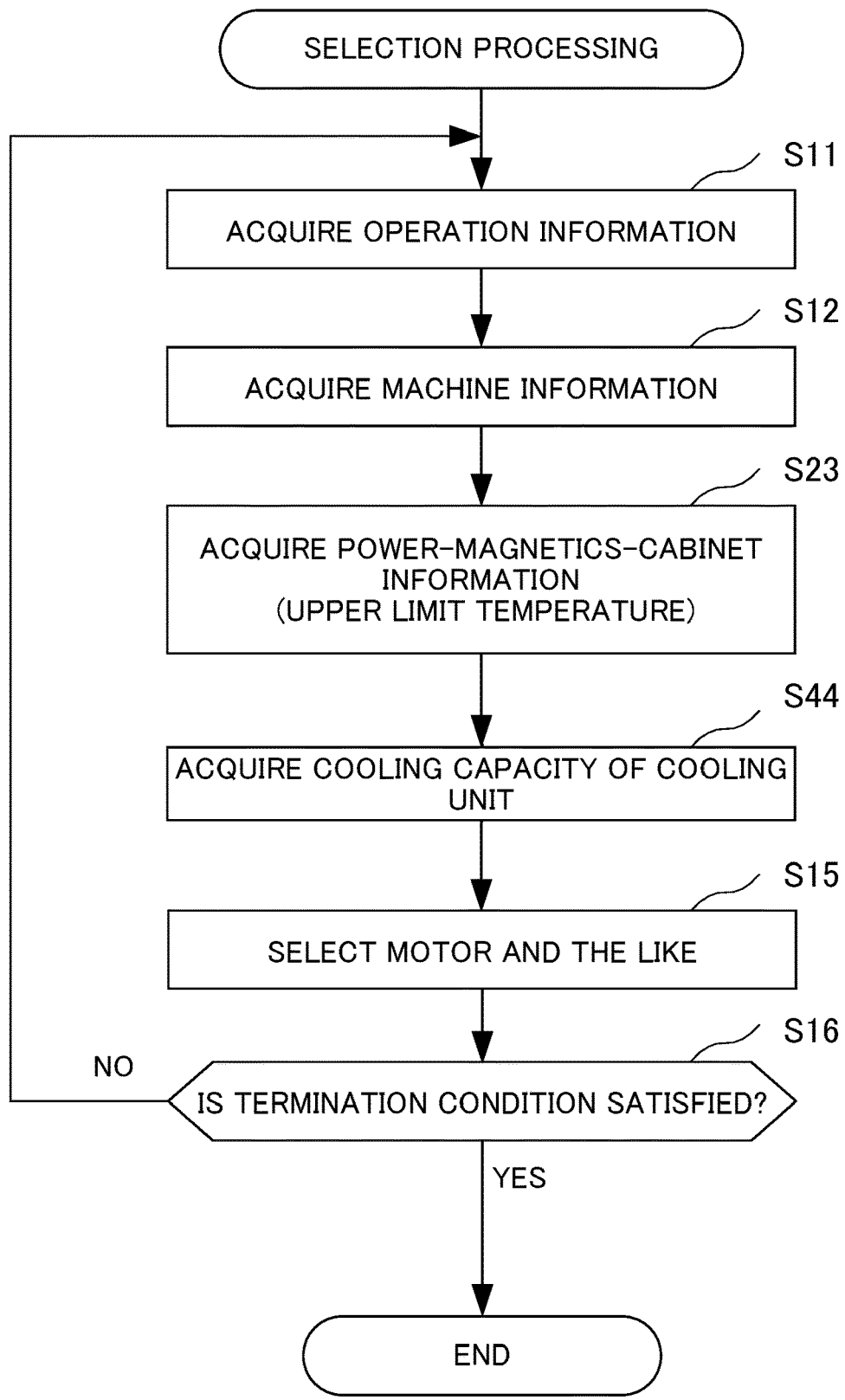
FIG. 7 is a flowchart indicating selection processing according to a fourth embodiment of the present invention.

The fourth embodiment is described with reference to FIG. 7. The selection unit 115 for selecting the motor 22 and the motor drive device 23 further functions in the selection processing in the fourth embodiment, as compared with the first embodiment. That is, the temperature estimation unit 112 estimates the temperature of the inside of the power magnetics cabinet 21, on the basis of the cooling capacity of the cooling device installed in the power magnetics cabinet 21 and the dimensions of the power magnetics cabinet 21. Thereafter, the selection unit 115 selects the motor and the motor drive device on the basis of the estimated temperature of the inside of the power magnetics cabinet 21 and the allowable upper limit temperature of the power magnetics cabinet 21, such that the temperature of the inside of the power magnetics cabinet 21 becomes equal to or lower than the upper limit temperature.

In the fourth embodiment, in the case where the dimensions of the power magnetics cabinet 21 are not able to be changed, the motor 22 and the motor drive device 23 are able to be selected by taking into consideration the upper limit temperature of the power magnetics cabinet 21 and the cooling capacity of the cooling device. It is noted that in FIG. 7, the same reference numeral is assigned to the same processing as in the first to third embodiments.

In step S11, the calculation unit 11 acquires the operation information. In step S12, the calculation unit 11 acquires the machine information. In step S23, the calculation unit 11 acquires the allowable upper limit temperature of the power magnetics cabinet 21, and temporarily records them in the RAM 13. In step S44, the selection unit 115 detects the cooling capacity of the cooling device installed in the power magnetics cabinet 21. The selection unit 115 reads out the information temporarily recorded in the RAM 13, and refers to the calorific value information database 16a, thereby selecting a motor and a motor drive device which allow the temperature to be kept equal to or lower than the upper limit temperature.

In step S16, whether or not a termination condition is satisfied is determined. One example of the termination condition is that the result of selection of a motor and the like is displayed on the result display screen 151. As described above, the selection processing in step S11 to step S16 enables to estimate the temperature of the power magnetics cabinet 21 with high accuracy, by taking into consideration the operation information and the machine information of the machine tool, the information on the upper limit temperature of the power magnetics cabinet 21, and further the cooling capacity of the cooling device, and further enables to select the motor drive device 23k which allow the temperature to be kept equal to or lower than the upper limit temperature.

Although the embodiments of the present invention have been described in detail so far, the above-described embodiments are merely specific examples for embodying the present invention. The technical scope of the present invention is not limited to the above-described embodiments. Various modifications are available in the present invention without departing from the spirit of the present invention, and these modifications are also included in the technical scope of the present invention.

In an example, the temperature estimation unit 112 may calculate a calorific value of a device (for example, a PLC) other than the motor 22 and the motor drive device 23, to estimate the temperature of the inside of the power magnetics cabinet 21. In the above-described embodiments, the motor drive device 23 is housed in the power magnetics cabinet 21.

However, the motor 22 may also be entirely or partially housed in the power magnetics cabinet 21. In this case, the temperature estimation unit 112 estimates the temperature of the inside of the power magnetics cabinet 21, on the basis of the calorific value generated by the motor 22 and the calorific value generated by the motor drive device 23. Although an allowable upper limit temperature of the power magnetics cabinet 21 is input as housing part information in the above-described embodiments, the input does not have to be of an upper limit temperature. Alternatively, in an example, a temperature desired by a user may be input.

Although the calorific value information DB 16a is included in the selection support system 1 in the descriptions of the above embodiments, the present invention is not limited thereto. That is, a part or the whole of the database may be included in another device (database server or the like) capable of communication via a network, and the selection support system 1 may be configured to access the database as needed via the network.

All or a part of the functions of the selection support system 1 according to the embodiments described above is enabled to be realized by hardware, software, or a combination thereof. Being realized by software herein means that a processor reads and executes programs, whereby the functions are realized. In the case of a configuration with hardware, a part or all of the functions of the selection support system 1 can be realized by an integrated circuit (IC), such as for example, an ASIC (Application Specific Integrated Circuit), a gate array, an FPGA (Field Programmable Gate Array), or a CPLD (Complex Programmable Logic Device).

In the case where all or a part of the functions of the selection support system 1 is configured with software, a computer is configured with a storage unit, such as a hard disk or a ROM, which stores the program describing all or a part of the operation of the selection support system 1, a DRAM for storing data required in calculation, a CPU, and a bus for connecting respective parts. The computer stores the information required in calculation in the DRAM, and makes the CPU execute the programs, whereby the functions are realized.

These programs may be stored by use of various types of computer readable media, and supplied to a computer. Computer readable media include various types of tangible storage media. Examples of the computer readable media include a magnetic recording medium (for example, a flexible disk, a magnetic tape, a hard disk drive), a magneto-optical recording medium (for example, a magneto optical disk), a CD-ROM (Read Only Memory), a CD-R, a CD-R/W, a DVD-ROM (Digital Versatile Disk), a DVD-R, a DVD-R/W, and a semiconductor memory (for example, a mask ROM, a PROM (Programmable ROM), an EPROM (Erasable PROM), a flash memory, and a RAM (Random Access Memory)). These programs may be distributed to a user's computer by being downloaded via a network.

EXPLANATION OF REFERENCE NUMERALS

1 . . . SELECTION SUPPORT SYSTEM
11 . . . CALCULATION UNIT
12 . . . ROM
13 . . . RAM
14 . . . INPUT UNIT
15 . . . DISPLAY UNIT
16 . . . STORAGE UNIT
16a . . . CALORIFIC VALUE INFORMATION DB
17 . . . COMMUNICATION UNIT
20 . . . SELECTION OBJECT
21 . . . POWER MAGNETICS CABINET
22 . . . MOTOR
23 . . . MOTOR DRIVE DEVICE
111 . . . UI DISPLAY CONTROL UNIT
112 . . . TEMPERATURE ESTIMATION UNIT
113 . . . DIMENSION CALCULATION UNIT
114 . . . NECESSITY DETERMINATION UNIT
115 . . . SELECTION UNIT
141 . . . OPERATION INFORMATION RECEPTION UNIT
142 . . . MACHINE INFORMATION RECEPTION UNIT
143 . . . POWER-MAGNETICS-CABINET INFORMATION RECEPTION UNIT
144 . . . DRIVE-UNIT INFORMATION RECEPTION UNIT
151 . . . RESULT DISPLAY SCREEN

What is claimed is:

1. A selection support system configured to select, by a selection screen, components constituting a machine tool, the machine tool including a drive system having a motor and a motor drive device configured to drive and control the machine tool, and a housing part configured to house at least a part of the drive system, the selection support system comprising a processor, the processor being configured to:
receive operation information on operation of the machine tool, machine information on a configuration of the machine tool, and housing part information on the housing part; and
estimate a temperature of an inside of the housing part, on a basis of the received operation information, the machine information, and an allowable upper limit temperature of the housing part,
wherein the processor calculates dimensions of the housing part, on a basis of the estimated temperature of the inside of the housing part and the allowable upper limit temperature of the housing part.

2. The selection support system according to claim 1, wherein
the processor determines whether or not a cooling device is required in the housing part, on a basis of the estimated temperature of the inside of the housing part, the allowable upper limit temperature of the housing part, and the dimensions of the housing part.

3. The selection support system according to claim 2, wherein the processor calculates a required cooling capacity of the cooling device when it is determined that the cooling device is required.

4. The selection support system according to claim 1, wherein
the processor estimates the temperature of the inside of the housing part, on a basis of a cooling capacity of a cooling device to be installed in the housing part and the dimensions of the housing part, and
selects the motor and the motor drive device on a basis of the estimated temperature of the inside of the housing part and the allowable upper limit temperature of the housing part, such that the temperature of the inside of the housing part becomes equal to or lower than the upper limit temperature.

5. The selection support system according to claim 1, wherein
the processor estimates the temperature of the inside of the housing part, on a basis of the operation information, the machine information and the allowable upper limit temperature of the housing part, and further a calorific value of a device other than the motor and the motor drive device in the drive system, and the other device corresponds to a device in the drive system to be housed in the housing part.

6. The election support system according to claim 1, wherein
the processor calculates the dimensions of the housing part such that the temperature of the inside of the housing part does not exceed the allowable upper limit temperature when the part of the drive system housed in the housing part is driven on a basis of the operation information and the machine information.

7. A selection support method for selecting, by a selection screen, components constituting a machine tool, the machine tool including a drive system having a motor and a motor drive device configured to drive and control the machine tool, and a housing part configured to house at least a part of the drive system, the selection support method comprising:
an information reception step for receiving operation information on operation of the machine tool, machine information on a configuration of the machine tool, and housing part information on the housing part; and
a calculation step, wherein
the calculation step has a temperature estimation step for estimating a temperature of an inside of the housing part, on a basis of the operation information, the machine information, and an allowable upper limit temperature of the housing part received in the information reception step, and
the calculation step further has a dimension calculation step for calculating dimensions of the housing part, on a basis of the estimated temperature of the inside of the housing part and the allowable upper limit temperature of the housing part.

8. The selection support method according to claim 7, wherein
the dimension calculation step calculates the dimensions of the housing part such that the temperature of the inside of the housing part does not exceed the allowable upper limit temperature when the part of the drive system housed in the housing part is driven on a basis of the operation information and the machine information.

* * * * *